United States Patent
Wicker et al.

[11] Patent Number: 5,993,594
[45] Date of Patent: Nov. 30, 1999

[54] PARTICLE CONTROLLING METHOD AND APPARATUS FOR A PLASMA PROCESSING CHAMBER

[75] Inventors: Thomas E. Wicker, Vallejo; Robert A. Maraschin, Cupertino, both of Calif.

[73] Assignee: LAM Research Corporation, Fremont, Calif.

[21] Appl. No.: 08/722,371

[22] Filed: Sep. 30, 1996

[51] Int. Cl.⁶ ........................................................ H05H 1/00
[52] U.S. Cl. ................ 156/345; 118/723 I; 204/298.07; 204/298.33
[58] Field of Search ........................ 156/345; 118/723 I, 118/723 E, 723 R; 204/298.34, 298.31, 298.07, 298.33

[56] References Cited

U.S. PATENT DOCUMENTS

| | | |
|---|---|---|
| 4,340,462 | 7/1982 | Koch . |
| 4,579,618 | 4/1986 | Celestino et al. . |
| 4,948,458 | 8/1990 | Ogle . |
| 5,198,718 | 3/1993 | Davis et al. . |
| 5,200,232 | 4/1993 | Tappan et al. . |
| 5,226,967 | 7/1993 | Chen et al. . |
| 5,241,245 | 8/1993 | Barnes et al. . |
| 5,262,029 | 11/1993 | Erskine et al. . |
| 5,304,279 | 4/1994 | Coultas et al. . |
| 5,401,350 | 3/1995 | Patrick et al. . |
| 5,445,776 | 8/1995 | Honma et al. .................. 264/65 |
| 5,460,684 | 10/1995 | Saeki et al. . |
| 5,464,476 | 11/1995 | Gibb et al. . |
| 5,494,713 | 2/1996 | Ootuki . |
| 5,525,159 | 6/1996 | Hama et al. . |
| 5,529,657 | 6/1996 | Ishii . |
| 5,531,834 | 7/1996 | Ishizuka et al. . |
| 5,580,385 | 12/1996 | Paranjpe et al. . |
| 5,746,875 | 5/1998 | Maydan et al. .................. 156/345 |

FOREIGN PATENT DOCUMENTS

| | | |
|---|---|---|
| 0268721 | 6/1988 | European Pat. Off. . |
| 0413282 | 2/1991 | European Pat. Off. . |
| 6-310065 | 11/1994 | Japan . |

*Primary Examiner*—Thi Dang
*Attorney, Agent, or Firm*—Burns,Doane, Swecker & Mathis, L.L.P.

[57] ABSTRACT

A plasma processing chamber includes a substrate holder and a member of silicon nitride such as a liner, focus ring or a gas distribution plate, the member having an exposed surface adjacent the substrate holder and the exposed surface being effective to minimize particle contamination during processing of substrates. The chamber can include an antenna which inductively couples RF energy through the gas distribution plate to energize process gas into a plasma state.

18 Claims, 4 Drawing Sheets

PARTICLE CONTROLLING METHOD AND APPARATUS FOR A PLASMA PROCESSING CHAMBER

FIELD OF THE INVENTION

The invention relates to improvements in a plasma processing chamber and to a method of processing a substrate in the plasma processing chamber such as by plasma etching an oxide layer on a semiconductor wafer.

BACKGROUND OF THE INVENTION

Vacuum processing chambers are generally used for chemical vapor depositing (CVD) and etching of materials on substrates by supplying process gas to the vacuum chamber and application of an RF field to the gas. Examples of parallel plate, transformer coupled plasma (TCP™, also called ICP), and electron-cyclotron resonance (ECR) reactors are disclosed in commonly owned U.S. Pat. Nos. 4,340,462; 4,948,458; and 5,200,232. The substrates are held in place within the vacuum chamber during processing by substrate holders. Conventional substrate holders include mechanical clamps and electrostatic clamps (ESC). Examples of mechanical clamps and ESC substrate holders are provided in commonly owned U.S. Pat. No. 5,262,029 and commonly owned U.S. application Ser. No. 08/401,524 filed on Mar. 10, 1995. Substrate holders in the form of an electrode can supply radiofrequency (RF) power into the chamber, as disclosed in U.S. Pat. No. 4,579,618.

Plasma processing systems wherein an antenna coupled to a radiofrequency (RF) source energizes gas into a plasma state within a process chamber are disclosed in U.S. Pat. Nos. 4,948,458; 5,198,718; 5,241,245; 5,304,279; and 5,401,350. In such systems, the antenna is located outside the process chamber and the RF energy is supplied into the chamber through a dielectric window. Such processing systems can be used for a variety of semiconductor processing applications such as etching, deposition, resist stripping, etc.

SUMMARY OF THE INVENTION

An object of the present invention is to reduce particle contamination of processed substrates when substrates are processed continuously by using silicon nitride as the material of a reactor surface such as a chamber liner surrounding the substrate holder, a focus ring surrounding the substrate and/or a gas distribution plate facing the substrate.

According to one aspect of the invention, a method of processing a substrate and reducing particle contamination thereof comprises placing a substrate on a substrate holder in a processing chamber wherein a member such as a liner, gas distribution plate and/or focus ring forms an exposed surface in the processing chamber in an area adjacent the substrate holder, the member comprising a silicon nitride based material and the member being effective to minimize particle contamination of the substrates during the processing step as a result of build-up of a highly intact passivating layer on the silicon nitride member and/or volatilization of plasma attacked portions of the silicon nitride member rather than breaking off of particles thereof. The method includes processing the substrate by supplying process gas to the processing chamber and energizing the process gas into a plasma state such as by inductively coupling RF energy through the gas distribution plate into the processing chamber and consecutively processing substrates in the processing chamber by contacting the substrates with the plasma gas. The processing chamber can include a substantially planar antenna and the process gas can be energized into the plasma state by supplying RF power to the antenna. The plasma can comprise a high density plasma and the substrates can be processed by etching an oxide layer on the substrates with the high density plasma while supplying an RF bias to the substrates. The member preferably consists essentially of hot pressed and sintered $Si_3N_4$.

According to another aspect of the invention, a plasma processing chamber includes a member comprising a silicon nitride based material, the member comprising a chamber liner, a focus ring and/or a gas distribution plate. The chamber further includes a substrate holder for supporting a substrate within the processing chamber, a gas supply supplying process gas to an interior of the chamber, and an energy source such as an RF energy source which supplies RF energy into the chamber to energize the process gas into a plasma state. The chamber can further include a dielectric window adjacent the gas distribution plate and the RF energy source can comprise a substantially planar antenna adjacent the window, the antenna supplying RF power through the window to energize process gas in the processing chamber into a plasma state. The antenna can be arranged such that the gas outlets in the gas distribution plate are not directly between the substrate holder and the antenna. The dielectric window can have a substantially uniform thickness and substantially planar configuration and the gas distribution plate can have a substantially uniform thickness and substantially planar configuration.

BRIEF DESCRIPTION OF THE DRAWINGS

The invention will be described in greater detail with reference to the accompanying drawings in which like elements bear like reference numerals, and wherein.

DETAILED DESCRIPTION OF THE PREFERRED EMBODIMENTS

The invention provides improvements in reducing particle contamination of substrates such as semiconductor wafers, flat panel display substrates, and the like. The particle reduction can be achieved by utilizing silicon nitride as the material for members adjacent the substrate being processed in the chamber. Such members include non-electrically driven chamber parts such as liners, focus rings, gas distribution plates, and the like.

In plasma etching of substrates, features can be etched into layers of various materials on substrates such as silicon wafers. In such etching processes, a gas distribution plate can be used to control the spacial distribution of gas flow in the volume of the reactor above the plane of the wafer. In the TCP 9100™ plasma etching reactor available from LAM Research Incorporated, the gas distribution plate is a circular plate situated directly below the TCP™ window which is also the vacuum sealing surface at the top of the reactor in a plane above and parallel to the wafer. The gas distribution plate is sealed using an O-ring to a gas distribution ring located at the periphery of the gas distribution plate. The gas distribution ring feeds gas from a source into the volume defined by the gas distribution plate, an inside surface of a window underlying a coil supplying RF energy into the reactor, and the gas distribution ring. The gas distribution plate contains an array of holes of a specified diameter which extend through the plate. The spacial distribution of the holes through the gas distribution plate can be varied to optimize etch uniformity of the layers to be etched, e.g., a photoresist layer, a silicon dioxide layer and an underlayer material on the wafer. The cross-sectional shape of the gas distribution plate can be varied to manipulate the distribution of RF power into the plasma in the reactor. The gas distribution plate material must be a dielectric to enable coupling of this RF power through the gas distribution plate into the reactor. Further, the material of the gas distribution plate must be highly resistant to chemical sputter-etching in environments such as oxygen or a hydrofluorocarbon gas plasma in order to avoid breakdown and the resultant particle generation associated therewith. Moreover, the material of the gas distribution plate should have low levels of contaminants that might otherwise affect performance of devices on the wafer.

According to the invention, it has surprisingly and unexpectedly been found that silicon nitride provides performance results which far exceed other materials such as aluminum nitride and alumina. In particular, when the gas distribution plate is made of silicon nitride, it is attacked at a much lower rate than a 99.5% or 99.9% pure alumina gas distribution plate and the silicon nitride gas distribution plate resulted in much lower particle "adds" (accumulated particles) to the wafers during plasma etching with hydrofluorocarbon gases.

Figure 1:
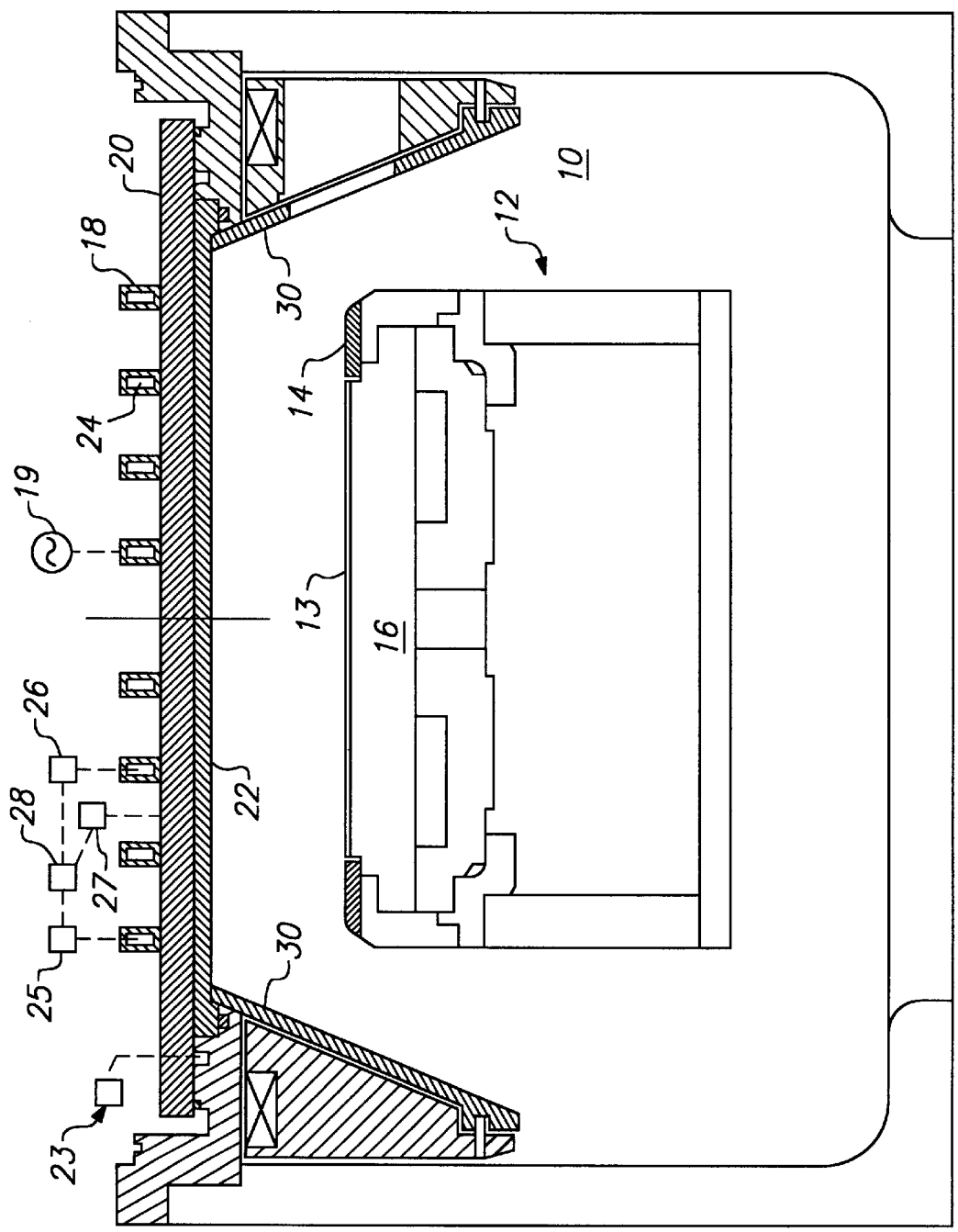
FIG. 1 is a cross sectional view of a vacuum processing chamber having a liner, focus ring and gas distribution plate according to the invention.

A vacuum processing chamber according to one embodiment of the present invention is illustrated in FIG. 1. The vacuum processing chamber 10 includes a substrate holder 12 providing an electrostatic clamping force to a substrate 13 as well as an RF bias to a substrate supported thereon and a focus ring 14 for confining plasma in an area above the substrate while it is He backcooled. A source of energy for maintaining a high density (e.g. $10^{11}$–$10^{12}$ ions/cm$^3$) plasma in the chamber such as an antenna 18 powered by a suitable RF source and suitable RF impedance matching circuitry inductively couples RF energy into the chamber 10 so as to provide a high density plasma. The chamber includes suitable vacuum pumping apparatus for maintaining the interior of the chamber at a desired pressure (e.g. below 50 mTorr, typically 1–20 mTorr). A substantially planar dielectric window 20 of uniform thickness is provided between the antenna 18 and the interior of the processing chamber 10 and forms the vacuum wall at the top of the processing chamber 10. A gas distribution plate, commonly called a showerhead 22, is provided beneath the window 20 and includes a plurality of openings such as circular holes (not shown) for delivering process gas supplied by the gas supply 23 to the processing chamber 10. A conical liner 30 extends from the gas distribution plate and surrounds the substrate holder 12. The antenna 18 can be provided with a channel 24 through which a temperature control fluid is passed via inlet and outlet conduits 25,26. However, the antenna 18 and/or window 20 could be cooled by other techniques such as by blowing air over the antenna and window, passing a cooling medium through or in heat transfer contact with the window and/or gas distribution plate, etc.

In operation, a wafer is positioned on the substrate holder 12 and is typically held in place by an electrostatic clamp, a mechanical clamp, or other clamping mechanism when He backcooling is employed. Process gas is then supplied to the vacuum processing chamber 10 by passing the process gas through a gap between the window 20 and the gas distribution plate 22. Suitable gas distribution plate arrangements (i.e., showerhead) arrangements are disclosed in commonly owned U.S. patent application Ser. Nos. 08/509,080; 08/658,258; and 08/658,259, the disclosures of which are hereby incorporated by reference. For instance, while the window and gas distribution plate arrangement in FIG. 1 are planar and of uniform thickness, non-planar and/or non-uniform thickness geometries can be used for the window and/or gas distribution plate. A high density plasma is ignited in the space between the substrate and the window by supplying suitable RF power to the antenna 18. A temperature control fluid can also be passed through the channel 24 in the antenna 18 to maintain the antenna 18, window 20 and gas distribution plate 22 at a temperature below a threshold temperature such as less than 120° C., preferably below 90° C. and more preferably below 80° C.

Figure 2:
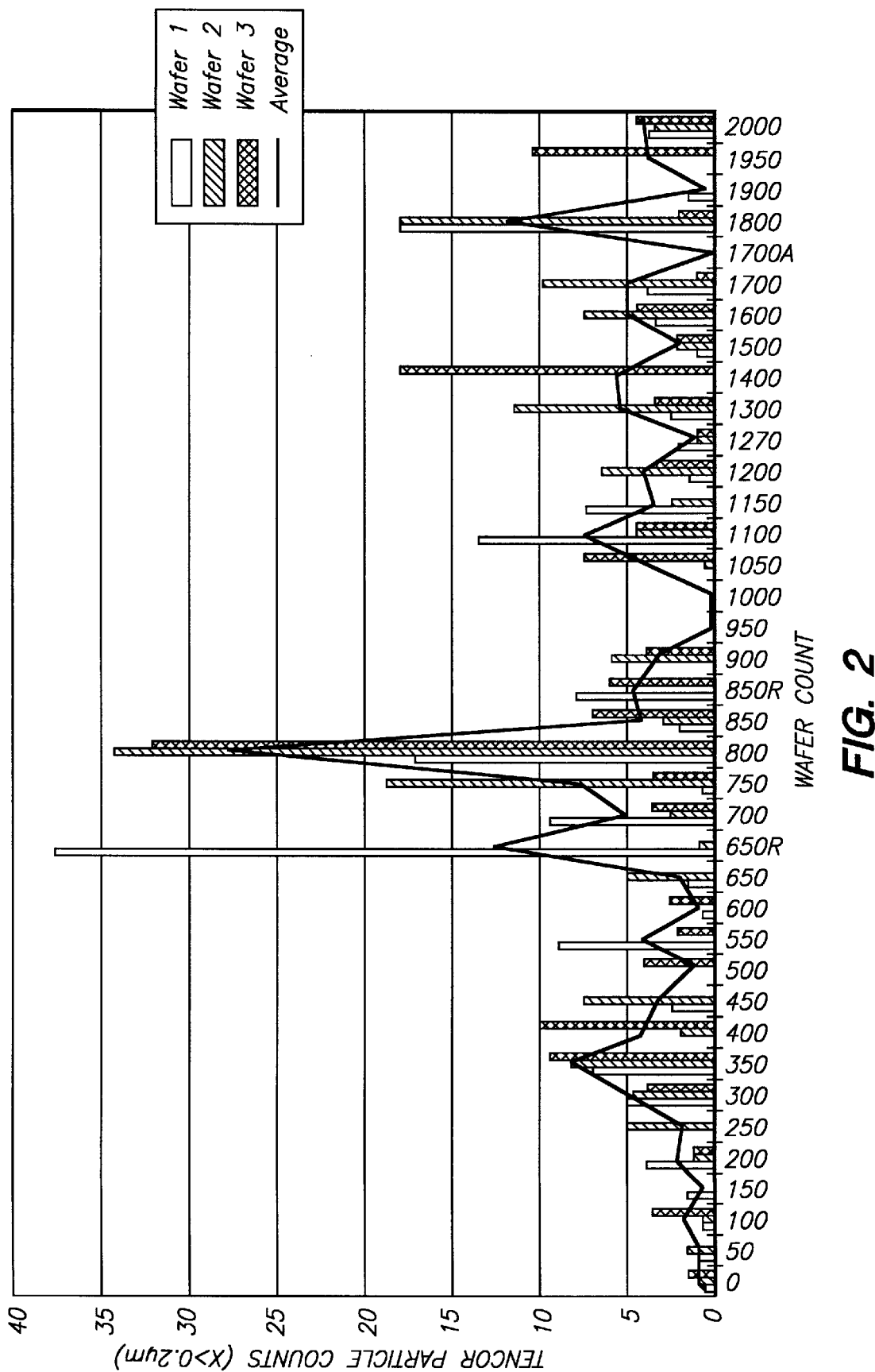
FIG. 2 is a particle versus wafer count graph which illustrates improvement in particle reduction on processed wafers achieved with a silicon nitride gas distribution plate in a processing chamber of the type shown in FIG. 1.
Figure 3:
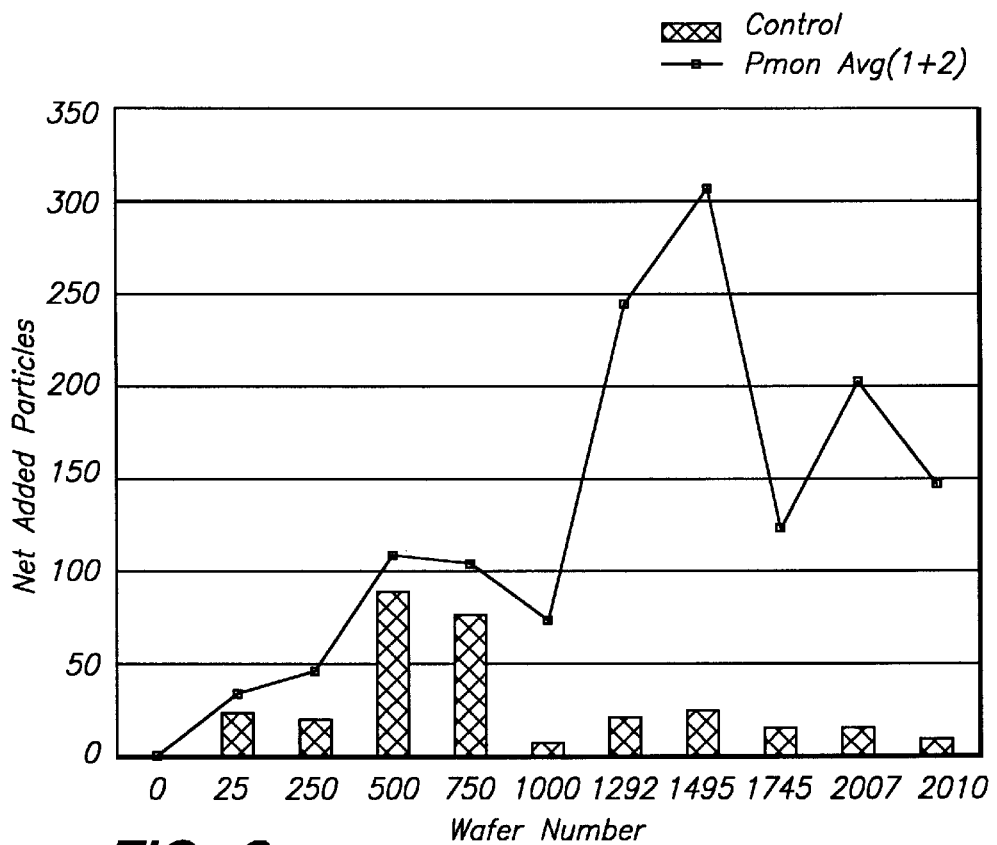
FIG. 3 is a particle versus wafer count graph which illustrates significant particle contamination on processed wafers when using an alumina gas distribution plate in a processing chamber of the type shown in FIG. 1.

FIG. 2 shows a comparison of wafer particle counts on wafers processed in a processing chamber having a hot-pressed silicon nitride gas distribution plate during an oxide etching process carried out for 20 seconds at a chamber pressure of 5 mTorr, TCP™ power (RF power supplied by antenna 18) at 1215 W, bottom electrode power (RF bias supplied by substrate holder 12) at 950 W with 30 sccm $C_2HF_5$ and 20 sccm $C_2F_6$ as the process gas. The silicon nitride gas distribution plate comprises a silicon nitride based material which can include an effective amount of a sintering aid such as a metal oxide sintering aid, e.g., MgO, $Al_2O_3$ or $SiO_2$. Such sintering aids are preferably provided in an amount of no greater than 3 wt % of the material used to produce the gas distribution plate, thus greatly reducing the aluminum contamination on the wafers compared to the case in which an alumina gas distribution plate is used. FIG. 3 shows particle counts for the same process in the case where the gas distribution plate is made of alumina.

From the graphs of FIGS. 2 and 3, it can be seen that the average particle contamination can be maintained below about 10 particles/wafer during a marathon run of 2000 wafers using the silicon nitride gas distribution plate whereas the average particle contamination was around 150 particles/wafer during a similar run using an alumina gas distribution plate. During oxide etching, polymer continuously builds-up on the alumina gas distribution plate and the built-up polymer flakes off and contaminates the wafers being processed. In contrast, a highly intact and uniform passivating layer forms on the silicon nitride gas distribution plate. This passivating layer on the silicon nitride is very uniform in thickness (e.g., less than 10 $\mu$m) and grows very slowly compared to the rate of growth of the polymer build-up on alumina. Thus, the passivating layer on the silicon nitride does not lead to the flaking problem seen with alumina components.

The gas distribution plate can have various designs such as those shown in FIGS. 4–7. The gas distribution plate 40 shown in FIG. 4 includes eighty-nine holes 41 and four embossments 42 near the center thereof for providing a passage for supply gas between the gas distribution plate and the dielectric window. The gas distribution plate 50 shown in FIGS. 5–7 includes thirty-one holes 51, channels 52 for supplying process gas to the holes 51 and the plate is thicker at an outer periphery 54 thereof for purposes of mating with a mounting arrangement of the chamber. The gas distribution plate, liner and/or focus ring can be mounted in chambers of the types disclosed in commonly owned U.S. patent application Ser. Nos. 08/658,261 and 08/658,262, the disclosures of which are hereby incorporated by reference.

Substrates which are etched in an oxide etching process generally include an underlayer, an oxide layer which is to be etched, and a photoresist layer formed on top of the oxide layer. The oxide layer may be one of $SiO_2$, BPSG, PSG, or other oxide material. The underlayer may be Si, TiN, silicide, or other underlying layer or substrate material. The etch selectivity, which is the etch rate of the layer to be etched compared to the photoresist etch rate is preferably around 4:1 or higher. The etch selectivity of the oxide layer compared to the underlayer is preferably greater than the oxide:photoresist etch selectively, e.g., 40:1.

According to the invention, the silicon nitride liner, focus ring and/or gas distribution plate reduces particle contamination of substrates during processing such as etching of dielectric materials such as silicon dioxide (e.g., doped or undoped TEOS, BPSG, USG (undoped spin-on-glass), thermal oxide, plasma oxide, etc.) typically overlying a conductive layer such as silicon, polysilicon, silicide, titanium nitride, aluminum or a non-conductive material such as silicon nitride. According to the invention, features (such as contact holes, vias, trenches, etc.) can be provided having dimensions of 0.5 μm and below and aspect ratios ranging from 2:1 to 7:1 can be etched from substrate to substrate during sequential batch processing of substrates such as semiconductor wafers (e.g., 25 or more consecutive wafers) while maintaining particle contamination of the wafers below acceptable levels.

During oxide etching, the chamber pressure is typically below 300 mTorr, preferably 1–40 mTorr, the antenna is powered at 200–5000 watts, preferably 300–2500 watts, the RF bias is ≦6000 watts, preferably 1000–2500 watts, and the He backpressure is 5–40 Torr, preferably 7–20 Torr. The process gas can include 10–200 sccm $CHF_3$, 10–100 sccm $C_2HF_5$ and/or 10–100 sccm $C_2F_6$.

Temperature control of the gas distribution plate 22 can be provided by using channel 24 for circulating a fluid through the antenna 18 from a closed circuit temperature controller 28. The temperature controller preferably monitors the window temperature such as by one or more temperature sensors 27 and controls coolant temperature and/or flow rate of coolant through the antenna 18 to maintain the window below a threshold temperature. The antenna 18 is preferably in good thermal contact with the window 20 to provide adequate heat transfer between the window and the antenna 18. The window is preferably made of a high thermal conductivity dielectric material such as aluminum nitride which maximizes heat transfer from the antenna 18 through the window to the gas distribution plate 22. Properties of aluminum nitride include thermal conductivity of 100 w/m-k, density of 3.27 g/cm³, heat capacity of 0.2 cal/gm-k, and emissivity of 0.75. The heat which is received by the gas distribution plate 22 due to ion bombardment from the plasma is passed through the window 20 and can be removed by passing cooling fluid within the antenna 18, increasing gas pressure between the window and gas distribution plate 22, blowing cooling gas over the antenna and/or adding a light gas such as He to the process gas distributed by the gas distribution plate.

The antenna 18 can have various shapes and profiles such as a substantially planar profile and/or a spiral shape having one or more (e.g., 3 to 7) turns in the spiral. The channel 24 preferably extends through all portions of the antenna 18 from a cooling fluid inlet to a cooling fluid outlet. For instance, the cooling fluid may flow from the exterior of the spiral antenna 18 toward the center, or from the center to the exterior thereof. The antenna may be bonded to the window by any suitable technique such as brazing, adhesive (e.g., RTV), etc., which provides good heat transfer characteristics between the antenna and the window. The cooling fluid which is passed through the antenna is preferably a non-conducting liquid such as deionized water, ethylene glycol, a conventional heat exchanger oil, or Fluoroinert (a dielectric fluid made by DuPont). Alternatively, the antenna can include a cooling tube which is bonded to a surface, such as a top surface, of the antenna. The cooling fluid is passed through the cooling tube in the same manner as the channel 24.

The gas distribution plate 22 is preferably formed as a separate piece attachable to the reaction chamber. Alternatively, the window 20 and the gas distribution plate 22 may be formed as a single piece. When formed as a single piece, higher thermal conductivity of the window/gas distribution plate 22 arrangement can be provided and/or the heat transfer across the window and the gas distribution plate 22 can be made more uniform. In making a single piece window/gas distribution plate, suitable gas passages and outlet holes can be provided in a green ceramic dielectric material which is later sintered to form a unitary plate. In order to prevent plasma from striking in the passages and/or holes, the dimensions of the passages and holes are preferably small enough to avoid conditions under which plasma would form during flow of process gas and powering of the antenna.

The liner, focus ring and/or gas distribution plate can be made of various blends of silicon nitride based powder material having a predominant amount of silicon nitride. For instance, the total amount of silicon nitride can be at least 90 wt %, preferably >95 wt %, and more preferably >97 wt %. Examples of suitable compositions include (1) 97.37% $Si_3N_4$+1.66 wt % MgO+0.97% $SiO_2$; (2) 98.366% $Si_3N_4$+ 0.908% MgO+0.726% $Al_2O_3$; (3) 97.496% $Si_3N_4$+1.12% MgO+0.487% $SiO_2$+0.897% $Al_2O_3$; and (4) 96.639% $Si_3N_4$+1.331% MgO+0.966% $SiO_2$+1.064% $Al_2O_3$. The silicon and nitrogen are preferably present in amounts to sufficient achieve a nominal $Si_3N_4$ stoichiometry. Such mixtures can be formed into a desired shape, sintered and machined to desired tolerances and/or surface finishes on surfaces such as vacuum sealing surfaces.

Figure 4:
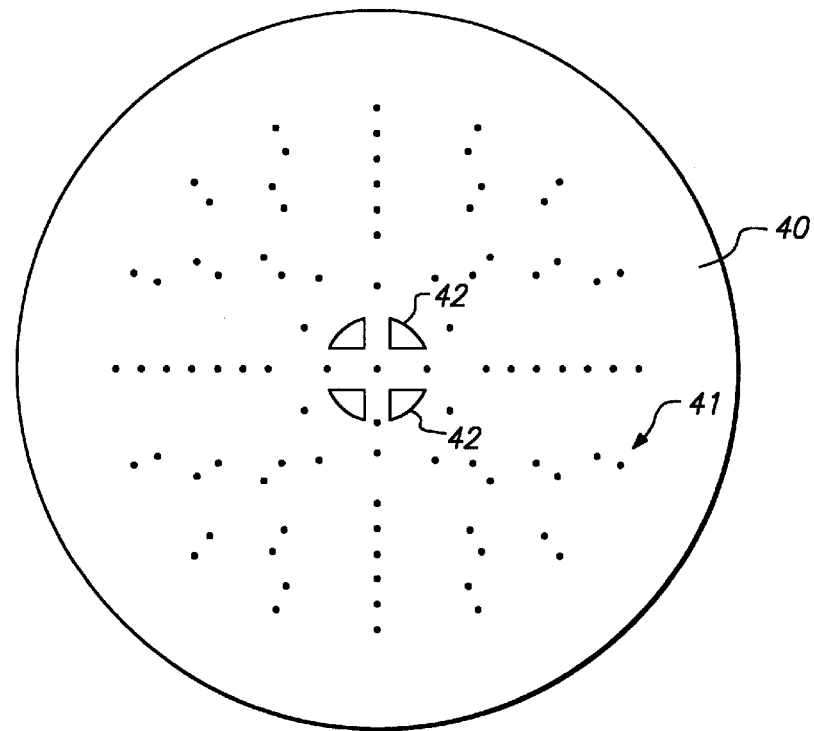
FIG. 4 is a top view of an 89 hole silicon nitride gas distribution plate according to the invention.

The gas distribution plate can include any desired hole pattern. An example of a suitable pattern is shown in FIG. 4 wherein 89 holes having diameters of 0.020 inch are provided. The hole pattern includes a center hole, 4 holes on a 2 inch diameter, 6 holes on a 3 inch diameter, 6 holes on a 4 inch diameter, 8 holes on a 5 inch diameter, 8 holes on a 6 inch diameter, 12 holes on a 7 inch diameter, 12 holes on an 8 inch diameter, 16 holes on a 9 inch diameter, and 16 holes on a 10 inch diameter. The plate also includes 4 embossments 0.020 inch thick near the center of the plate for purposes of separating the plate from the overlying window.

Figure 5:
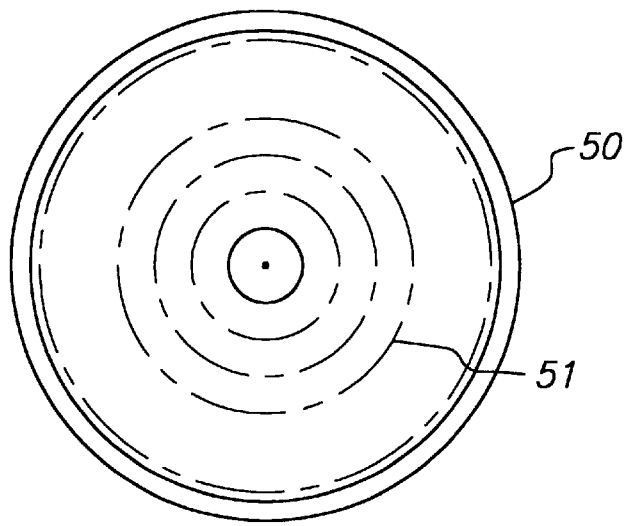
FIG. 5 is a view of one side of a 31 hole silicon nitride gas distribution plate according to the invention.
Figure 6:
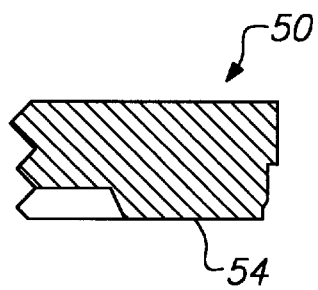
FIG. 6 is a cross-section of an outer edge of the gas distribution plate shown in FIG. 5.

FIG. 5 shows a gas distribution plate according to the invention having 31 holes with 0.025 inch diameters. The hole pattern includes a center hole, 4 holes on a 2 inch diameter, 6 holes on a 4 inch diameter, 8 holes on a 6 inch diameter and 12 holes on an 8 inch diameter. The plate also includes a thicker outer edge thereof as shown in FIG. 6.

Figure 7:
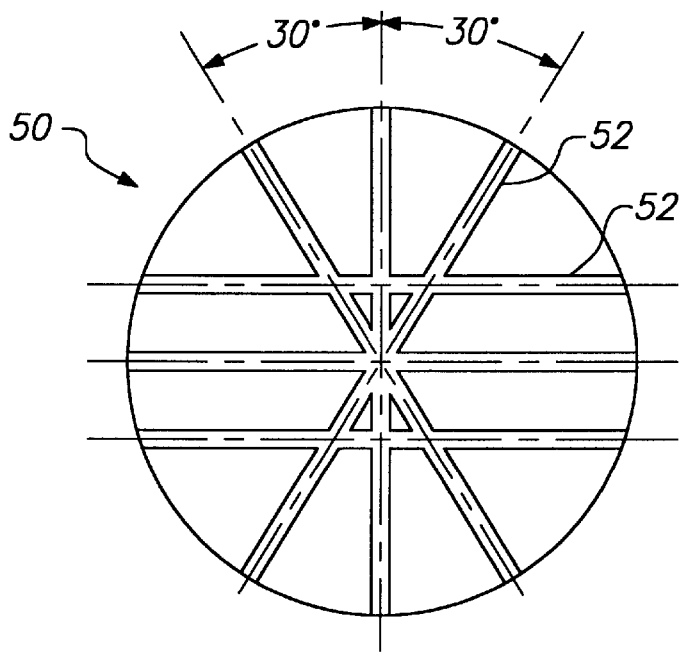
FIG. 7 is a view of an opposite side of the gas distribution plate shown in FIG. 5.

Further, the surface of the plate facing the overlying window includes a pattern of rectangular grooves therein which distribute process gas to the gas outlets shown in FIG. 5. As shown in FIG. 7, 6 radially extending grooves are provided which are each 0.015 inch deep and 0.35 inch wide.

In the case where the electric field produced by the antenna is of sufficient strength to light a plasma in the holes of the gas distribution plate, the antenna is preferably located such that portions thereof do not overlie any outlet holes in the gas distribution plate. For instance, if the antenna comprises a multi-turn coil and the gas distribution plate includes a center hole and various holes located on one more circles at fixed radii from the center hole, the antenna is preferably located such that any turn passing through the circles is located between a pair of adjacent holes located on the circles. Such positioning of the antenna would minimize the possibility of striking a plasma in the holes located closest to the antenna.

The silicon nitride gas distribution plate according to the invention provides dramatic reduction in particle count on wafers processed during oxide etching and oxygen cleaning steps. For instance, the silicon nitride gas distribution plate also reduces particle contamination during an ashing process wherein 750 sccm oxygen gas can be run for 10 seconds with the TCP™ power at 650 W, the bottom electrode at 750 W and the pressure at 10 mTorr. Compared to an alumina gas distribution plate which is attacked during the etching and oxygen cleaning steps and causes alumina particles to fall on wafers, the silicon nitride gas distribution plate provides better contamination performance since the bi-products produced when the silicon nitride material is attacked during the etching and oxygen cleaning steps are volatile and thus do not contribute to adding particles on the wafers.

The silicon nitride gas distribution plate can be made in various ways. For instance, the silicon nitride can be hot pressed at temperatures above 1500° C. using a powder that contains a high percentage of alpha silicon nitride. During hot pressing at such temperatures, the alpha phase transforms to the beta-modification and transformation and densification is dependent on the pressure, temperature and alpha/beta phase ratio of the starting powders. Typical additives for silicon nitride include MgO, $Y_2O_3$, $CeO_2$, $ZrO_2$ and $Al_2O_3$ and possibly other rare-earth oxides. The hot pressing can be carried by processes such as hot isostatic pressing or gas pressure sintering. Compared to hot isostatically pressed silicon nitride, the gas pressure sintered material may exhibit a coarser structure with high aspect ratio grains whereas the pressed material may have a finer, more equiaxed structure. The gas pressure sintering may be conducted using nitrogen gas pressures up to 2 MPa wherein the nitrogen gas suppresses the thermal decomposition of silicon nitride and allows higher sintering temperatures to be used for densification. Hot pressed silicon nitride can be formed by the application of heat and uniaxial pressure in graphite dies heated by induction to temperatures in the range of 1650 to 1850° C. for 1 to 4 hours under an applied stress of 15 to 30 MPa. Another technique involves firing a shaped component of silicon nitride at 1700 to 1800° C. under a nitrogen atmosphere at 0.1 MPa. Another technique involves adding additives such as MgO or $Y_2O_3$ with silicon prior to shaping and then nitration is carried out followed by firing in the range of 1800 to 2000° C. under a nitrogen atmosphere. Other techniques for preparing the silicon nitride gas distribution plate according to the invention will be apparent to the skilled artisan.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A plasma processing chamber comprising:
   a substrate holder for supporting a substrate within an interior of the processing chamber;
   a member having an exposed surface adjacent the substrate, the member comprising a silicon nitride based material;
   a gas supply supplying process gas to the interior of the processing chamber; and
   an energy source supplying energy into the interior of the processing chamber and energizing the process gas into a plasma state for processing a substrate, the member minimizing particle contamination of substrates during processing thereof by the plasma as a result of build-up of a highly intact passivating layer on the silicon nitride member and/or volatilization of portions of the silicon nitride member attacked by the plasma rather than breaking off of particles thereof.

2. The plasma processing chamber according to claim 1, wherein the member comprises a gas distribution plate and the processing chamber further comprises a dielectric window adjacent the gas distribution plate.

3. The plasma processing chamber according to claim 1, wherein the processing chamber includes a dielectric window and the energy source comprises an RF energy source in the form of a substantially planar antenna adjacent the window, the antenna supplying RF power through the window to energize process gas in the processing chamber into a plasma state.

4. The plasma processing chamber according to claim 1, wherein the member comprises a gas distribution plate, a focus ring and/or a chamber liner.

5. The plasma processing chamber according to claim 3, wherein the member comprises a gas distribution plate having gas outlets supplying the process gas to the interior of the processing chamber.

6. The plasma processing chamber according to claim 3, wherein the dielectric window has a substantially uniform thickness and substantially planar configuration.

7. The plasma processing chamber according to claim 1, wherein the member comprises a gas distribution plate having a substantially uniform thickness and substantially planar configuration.

8. The plasma processing chamber according to claim 1, wherein the member comprises a gas distribution plate having a plurality of radially extending channels on one side thereof and a plurality of gas outlets on an opposite side thereof, the channels supplying the process gas to the gas outlets.

9. The plasma processing chamber according to claim 1, wherein the member consists essentially of hot-pressed and sintered $Si_3N_4$.

10. A gas distributing plate adapted for mounting thereof in a plasma processing chamber including a dielectric window, an RF antenna outside the window, a gas supply supplying process gas which is energized into a plasma state in the interior of the processing chamber by the RF antenna and a substrate holder for supporting a substrate within the interior of the processing chamber, the gas distributing plate comprising:

a first surface adapted to face the dielectric window and a second surface adapted to face the substrate, the second surface including gas outlets for supplying process gas into the interior of the processing chamber, the gas distribution plate comprising a silicon nitride based material and being effective to minimize particle contamination of substrates during processing thereof by the plasma as a result of build-up of a highly intact passivating layer on the silicon nitride based material and/or volatilization of plasma portions of the silicon nitride member attacked by the plasma rather than breaking off of particles thereof.

11. The gas distribution plate according to claim 10, wherein the silicon nitride based material includes at least 95 wt % silicon nitride.

12. The gas distribution plate according to claim 10, wherein the gas distribution plate has a substantially uniform thickness and substantially planar configuration.

13. The gas distribution plate according to claim 10, wherein the gas distribution plate includes a plurality of radially extending channels on the first side thereof, the channels supplying the process gas to the gas outlets.

14. The gas distribution plate according to claim 10, wherein the entire gas distribution plate consists essentially of hot-pressed and sintered $Si_3N_4$.

15. A plasma processing chamber comprising:

a substrate holder for supporting a substrate within an interior of the processing chamber;

a gas distribution plate having an exposed surface adjacent the substrate, the gas distribution plate comprising a silicon nitride based material;

a focus ring comprising silicon nitride material, the focus ring supported within the interior of the processing chamber at a location so as to surround a substrate supported on the substrate support;

a chamber liner comprising silicon nitride material, the chamber liner having an inner surface facing the interior of the processing chamber;

a dielectric window adjacent the gas distribution plate;

a gas supply supplying process gas to the interior of the processing chamber; and an energy source comprising a substantially planar antenna adjacent the window supplying energy into the interior of the processing chamber and energizing the process gas into a plasma state for processing a substrate, the member minimizing particle contamination of substrates during processing thereof by the plasma as a result of build-up of a highly intact passivating layer on the silicon nitride member and/or volatilization of plasma portions of the silicon nitride member attacked by the plasma rather than breaking off of particles thereof.

16. The plasma processing chamber according to claim 15, wherein the gas distribution plate has a substantially uniform thickness and substantially planar configuration.

17. The plasma processing chamber according to claim 15, wherein the gas distribution plate has a plurality of radially extending channels on one side thereof and a plurality of gas outlets on an opposite side thereof, the channels supplying the process gas to the gas outlets.

18. The plasma processing chamber according to claim 15, wherein the member consists essentially of hot-pressed and sintered $Si_3N_4$.

* * * * *